United States Patent
Uchida

(10) Patent No.: US 9,999,119 B2
(45) Date of Patent: Jun. 12, 2018

(54) ELECTRONIC CONTROL UNIT

(71) Applicant: DENSO CORPORATION, Kariya, Aichi-pref. (JP)

(72) Inventor: Takayuki Uchida, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days. days.

(21) Appl. No.: 15/090,231

(22) Filed: Apr. 4, 2016

(65) Prior Publication Data

US 2016/0295683 A1    Oct. 6, 2016

(30) Foreign Application Priority Data

Apr. 6, 2015 (JP) ................................. 2015-77730

(51) Int. Cl.
  *H05K 7/20* (2006.01)
  *H05K 1/02* (2006.01)

(52) U.S. Cl.
  CPC ....... *H05K 1/0209* (2013.01); *H05K 7/20463* (2013.01); *H05K 2201/066* (2013.01); *H05K 2201/1053* (2013.01); *H05K 2201/1056* (2013.01); *H05K 2201/10522* (2013.01)

(58) Field of Classification Search
  CPC .... H05K 1/0203; H05K 1/181; H05K 1/0209; H05K 2201/066; H05K 2201/10522; H05K 2201/1053; H05K 2201/1056
  See application file for complete search history.

(56) References Cited

U.S. PATENT DOCUMENTS

| | | | |
|---|---|---|---|
| 5,581,443 A | 12/1996 | Nakamura et al. | |
| 5,784,256 A | 7/1998 | Nakamura et al. | |
| 6,178,318 B1 * | 1/2001 | Holmberg | H05K 9/003 174/358 |
| 6,744,640 B2 * | 6/2004 | Reis | H01L 23/552 174/383 |
| 8,654,537 B2 * | 2/2014 | Fisher, Jr. | H05K 3/284 174/394 |
| 9,048,124 B2 * | 6/2015 | Dolci | |
| 2011/0013365 A1 | 1/2011 | Oota | |
| 2011/0013370 A1 | 1/2011 | Oota | |
| 2011/0090625 A1 | 4/2011 | Oota | |
| 2011/0304248 A1 | 12/2011 | Oota | |
| 2012/0039054 A1 | 2/2012 | Oota | |

(Continued)

FOREIGN PATENT DOCUMENTS

JP        2010-225674    10/2010

*Primary Examiner* — Robert J Hoffberg
*Assistant Examiner* — Hung Dang
(74) *Attorney, Agent, or Firm* — Knobbe, Martens, Olson & Bear, LLP

(57) ABSTRACT

Heating elements are mounted on a substrate. A heat sink is provided to be capable of releasing heat of the heating elements. Each radiating component is provided between a corresponding one of the heating elements and the heat sink, and is provided in a corresponding one of radiating regions. Each radiating region includes a corresponding one of mounting portions of the heating elements. A gap part is formed in an area surrounded by the radiating components each of which is provided at a corresponding one of the radiating regions. Each heating element is located in a corresponding one of the radiating regions. There is not any one of the radiating components disposed at the gap part.

6 Claims, 13 Drawing Sheets

(56) References Cited

U.S. PATENT DOCUMENTS

| | | |
|---|---|---|
| 2014/0225482 A1 | 8/2014 | Hara et al. |
| 2015/0189733 A1 | 7/2015 | Shibata |
| 2015/0189794 A1 | 7/2015 | Tashima et al. |

\* cited by examiner

US 9,999,119 B2

ELECTRONIC CONTROL UNIT

CROSS REFERENCE TO RELATED APPLICATION

This application is based on Japanese Patent Application No. 2015-77730 filed on Apr. 6, 2015, the disclosure of which is incorporated herein by reference.

TECHNICAL FIELD

The present disclosure relates to an electronic control unit.

BACKGROUND

There has been known an electronic control unit that controls motor operation. For example, the electronic control unit of JP2014-154745A includes a second metal plate exposed from a semiconductor module, a second specific shape part projecting from a radiator toward the semiconductor module, and a second heat conduction component sandwiched between the second metal plate and the second specific shape part.

When a radiating gel is disposed in the entire portion where a plurality of electronic components are provided while no partition exists between the electronic components, air may be incorporated into the radiating gel depending on a condition of the applied gel, degrading radiation performance. Moreover, it is necessary to design the application pattern or necessary to use a large amount of radiating gel not to cause the radiating gel to incorporate air.

SUMMARY

The present disclosure addresses at least one of the above issues. Thus, it is an objective of the present disclosure to provide an electronic control unit that allows the radiating component to be appropriately disposed.

To achieve the objective of the present disclosure, there is provided an electronic control unit including a substrate, three or more heating elements, a heat sink, three or more radiating components, and a gap part. The three or more heating elements are mounted on the substrate. The heat sink is provided to be capable of releasing heat of the three or more heating elements. Each of the three or more radiating components is provided between a corresponding one of the three or more heating elements and the heat sink, and is provided in a corresponding one of three or more radiating regions. Each of the three or more radiating regions includes a corresponding one of mounting portions of the three or more heating elements. The gap part is formed in an area surrounded by the three or more radiating components each of which is provided at a corresponding one of the three or more radiating regions. Each of the three or more heating elements is located in a corresponding one of the three or more radiating regions. There is not any one of the three or more radiating components disposed at the gap part.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
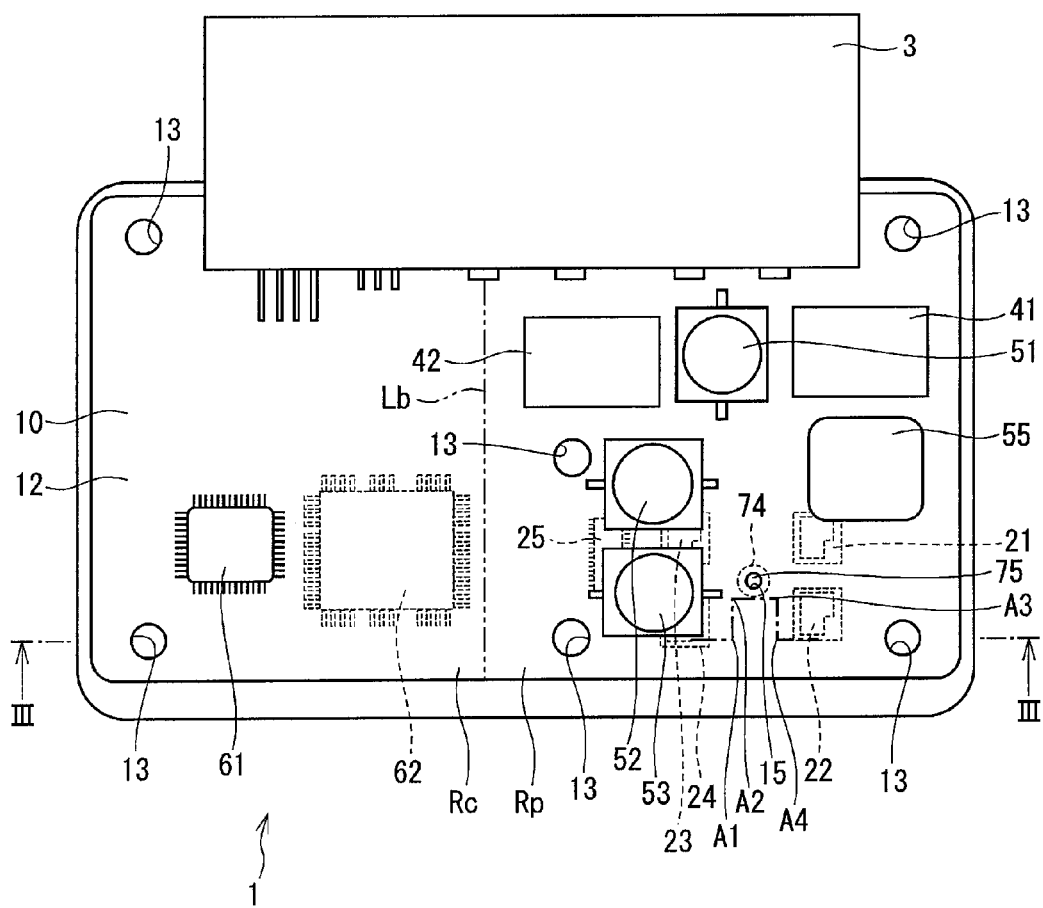
FIG. 1 is a plan view of an electronic control unit according to a first embodiment.

Hereinafter, an electronic control unit according to the present disclosure is described with reference to the accompanying drawings. In the following embodiments, substantially the same configuration is designated by the same numeral, and duplicated description is omitted.

First Embodiment

A first embodiment is described with reference to FIGS. 1 to 7. As illustrated in FIG. 6, an electronic control unit 1 of the first embodiment is applied to an electromotive power steering system 100 of a vehicle, and controls operation of a motor 101 that generates assist torque assisting steering by a driver according to a steering torque signal, a vehicle speed signal, and the like. The motor 101 in the first embodiment is a DC brush motor. The electronic control unit 1 is connected to the motor 101 by a harness 103 and connected to a battery 102 by a harness 104.

Figure 2:
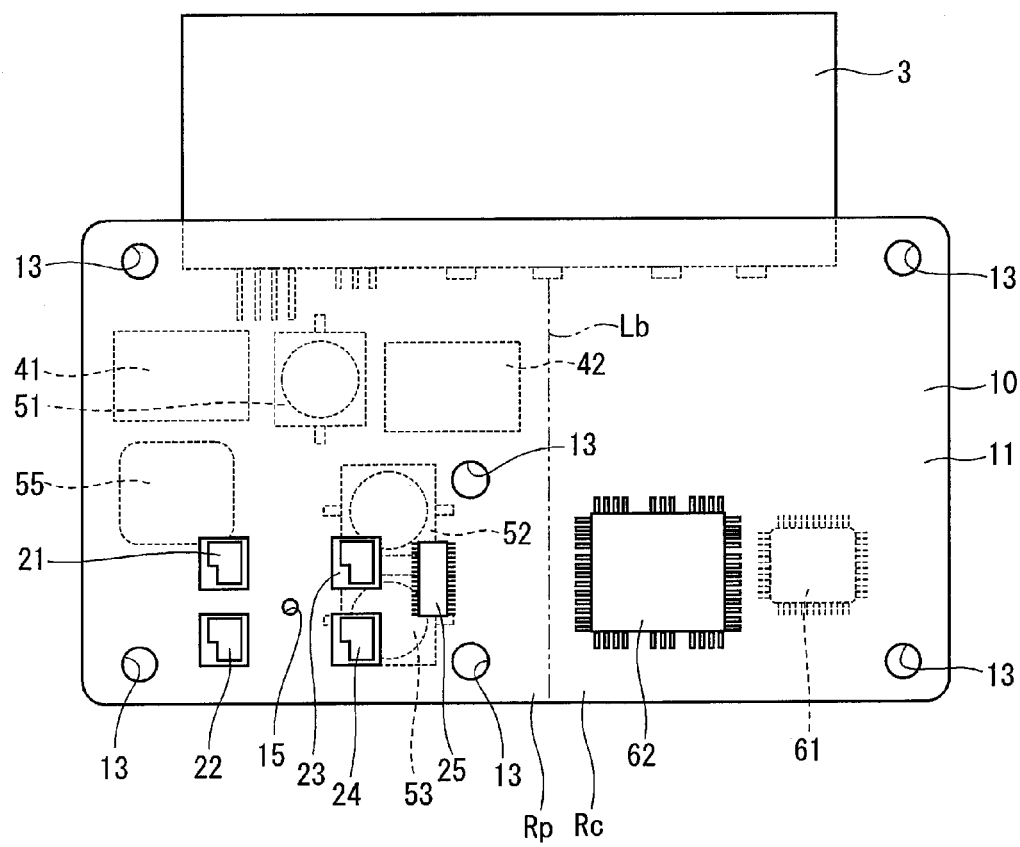
FIG. 2 is a plan view illustrating a substrate surface on a side close to a heat sink according to the first embodiment.
Figure 3:
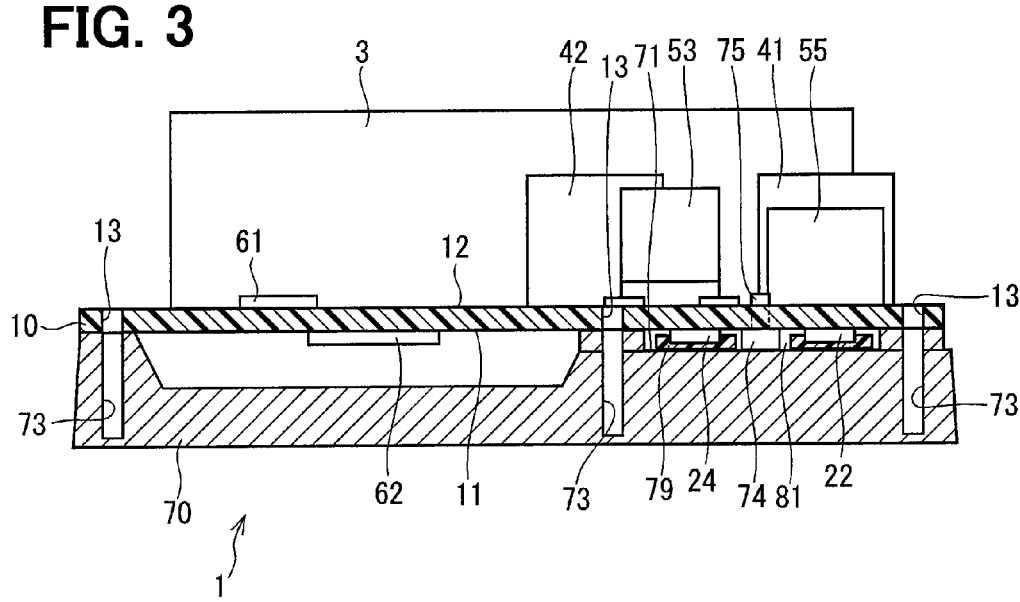
FIG. 3 is a sectional view along a line III-A1-A2-A3-A4-III in FIG. 1.

As illustrated in FIGS. 1 to 3, the electronic control unit 1 includes a substrate 10, switching elements 21 to 24, a shunt resistance 25, relays 41 and 42, capacitors 51 to 53, a coil 55, a control part 60 (see FIG. 7), a heat sink 70, and a radiating gel 79 as a radiating component. In FIG. 3, each electronic component mounted on the substrate 10 is not hatched.

Figure 7:
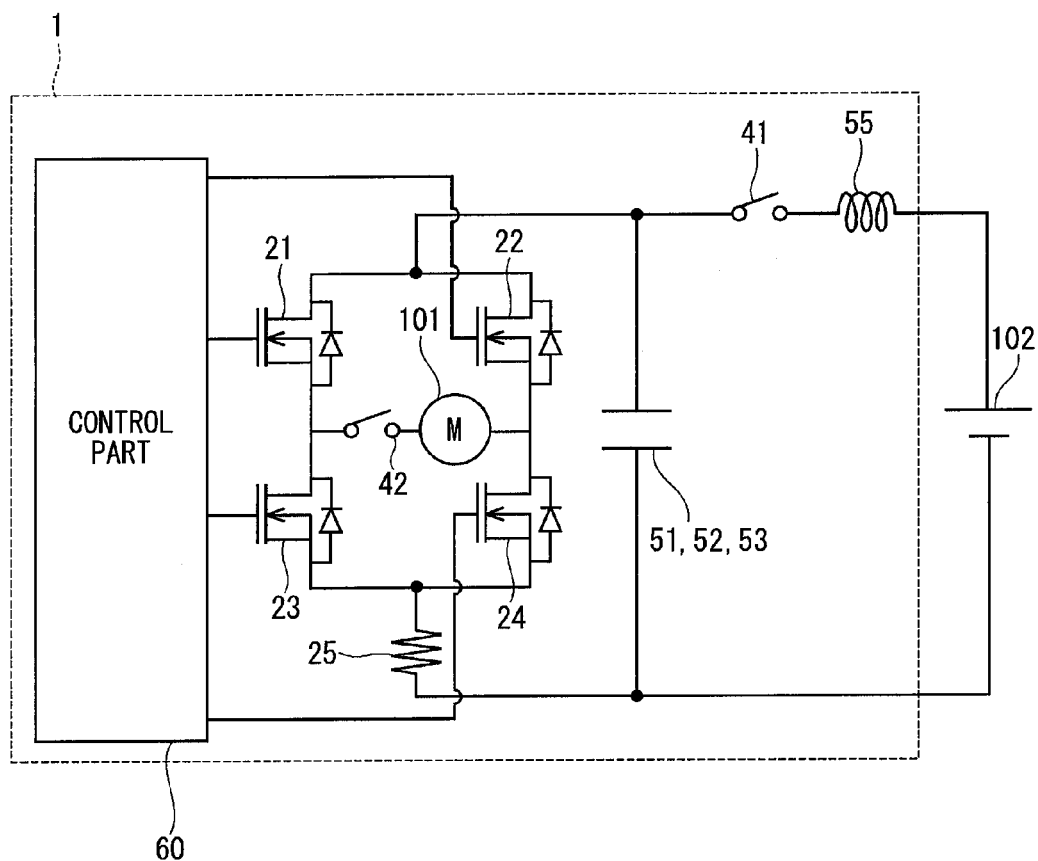
FIG. 7 illustrates an electrical configuration of the electronic control unit according to the first embodiment.

A circuit configuration of the electronic control unit 1 is now described with reference to FIG. 7. The motor 101 in FIG. 7 is shown in the inside of the electronic control unit 1 for convenience while being actually provided outside thereof. The same holds true for FIG. 12. The switching elements 21 to 24 each perform on-off operation while being controlled according to a control signal from the control part 60. The control part 60 controls the on-off operation of each of the switching elements 21 to 24 and thus controls operation of the motor 101. Although the switching elements 21 to 24 are each a metal-oxide-semiconductor field-effect transistor (MOSFET) in the first embodiment, the switching element may be an insulated gate bipolar transistor (IGBT).

The switching elements 21 to 24 are in an H bridge connection. In detail, the switching elements 21 and 23 are connected in series, while the switching elements 22 and 24 are connected in series. The switching elements 21 and 23 connected in series are connected in parallel with the switching elements 22 and 24 connected in series. The node of the switching elements 21 and 22 connected to a high potential side is connected to the positive electrode of the battery 102 via a power relay 41 and the coil 55. The node of the switching elements 23 and 24 connected to a low potential side is connected to the negative electrode of the battery 102 via the shunt resistance 25. A motor relay 42 and the motor 101 are connected between the node of the switching elements 21 and 23 and the node of the switching elements 22 and 24. In the first embodiment, each of the power relay 41 and the motor relay 42 is a mechanically structured, mechanical relay.

The shunt resistance 25 detects a current applied to the motor 101. Each of the capacitors 51 to 53 is, for example, an aluminium electrolytic capacitor, and is connected in parallel with the battery 102. The capacitor stores electrical charges, and thereby assists power supply to the switching elements 21 to 24, and suppresses noise components such as a surge voltage. The coil 55 is, for example, a chalk coil, and is connected between the battery 102 and the power relay 41 so as to reduce noise.

The control part 60 includes a microcomputer 61 and a custom IC 62 (see FIGS. 1 to 3). Each of the microcomputer 61 and the custom IC 62 is a semiconductor package including CPU, ROM, RAM, and I/O, for example. The control part 60 controls each of operations of the relay 41 and 42 and the switching elements 21 to 24. The control part 60 controls each of operations of the switching elements 21 to 24 according to signals from sensors provided in various parts of a vehicle, and thereby controls rotation of the motor 101.

As illustrated in FIGS. 1 to 3, the switching elements 21 to 24, the shunt resistance 25, the relays 41 and 42, the capacitors 51 to 53, the coil 55, the microcomputer 61, and the custom IC 62 are mounted on the substrate 10. In the first embodiment, the substrate 10 has a first surface 11 on a side close to the heat sink 70, and a second surface 12 on a side opposite to the side close to the heat sink 70. A connector 3 used for connection to the motor 101 and the battery 102 is fixed to the second surface 12 of the substrate 10.

For example, the substrate 10 is a printed circuit board such as a FR-4 board configured of fibrous glass and epoxy resin, and is formed into a roughly rectangular shape. The substrate 10 has holes 13. An undepicted fixing component such as a screw is inserted into each hole 13 to fix the substrate 10 to the heat sink 70. In the first embodiment, the substrate 10 is divided into two regions, power region Rp and control region Rc, by a two-dot chain line Lb as shown in FIGS. 1 and 2.

The switching elements 21 to 24 and the shunt resistance 25 are mounted on the first surface 11 of the power region Rp, and the power relay 41, the motor relay 42, the capacitors 51 to 53, and the coil 55 are mounted on the second surface 12 thereof. The custom IC 62 is mounted on the first surface 11 of the control region Rc, and the microcomputer 61 is mounted on the second surface 12 thereof.

In the first embodiment, the switching elements 21 to 24, the shunt resistance 25, the relays 41 and 42, the capacitors 51 to 53, and the coil 55, which are each a power component receiving a large current, are mounted in the power region Rp, and the microcomputer 61 and the custom IC 62, which are each a control component receiving no large current, are mounted in the control region Rc. The microcomputer 61 and the custom IC 62 are mounted not in the power region Rp but in the control region Rc, thereby such control components can be less affected by noise caused by a large current applied to the power components such as the switching elements 21 to 24.

The heat sink 70 is generally formed into a roughly plate shape with a material having high heat conductance such as aluminum. The switching elements 21 to 24 and the shunt resistance 25 mounted on the first surface 11 of the substrate 10 are provided on a radiating part 71 of the heat sink 70 so as to allow heat radiation through the radiating gel 79. In the first embodiment, the switching elements 21 to 24 and the shunt resistance 25 correspond to "heating elements", and are appropriately referred to as "heating elements 21 to 25" below.

The radiating gel 79 is applied onto the radiating part 71 of the heat sink 70 in a dotted or linear pattern, and is then sandwiched between the heat sink 70 and the substrate 10, and thus spreads over a region corresponding to the application pattern. The term "dotted application" means that each application of the radiating gel is performed with a dispenser or the like being not moved on an application surface while application pattern of the radiating gel 79 is a roughly circular pattern rather than an exactly dotted pattern. The term "linear application" means that each application is performed with a dispenser or the like being moved on the application surface while the application pattern of the radiating gel 79 is not an exactly linear pattern. For example, if the radiating gel is applied with the dispenser or the like being straightly moved, the radiating gel is applied in a roughly oval pattern. The linear application may be performed not only in a straight pattern but also in an arcuate pattern, for example.

When the substrate 10 is assembled to the heat sink 70, the radiating gel 79 applied onto the heat sink 70 is sandwiched between the heat sink 70 and the substrate 10 and thus spreads over a region corresponding to the application pattern and to the amount of applied radiating gel. Specifically, the radiating gel 79 applied in a dotted pattern spreads over a roughly circular region between the substrate 10 and the heat sink 70. The radiating gel 79 applied in a straight pattern spreads over an elliptic or oval region between the substrate 10 and the heat sink 70. A larger amount of applied radiating gel 79 expands a spreading area of the radiating gel 79 between the substrate 10 and the heat sink 70. In the first embodiment, the radiating gel 79 is applied so as to spread over radiating regions H21 to H25 corresponding to the heating elements 21 to 25, respectively.

Figure 14:
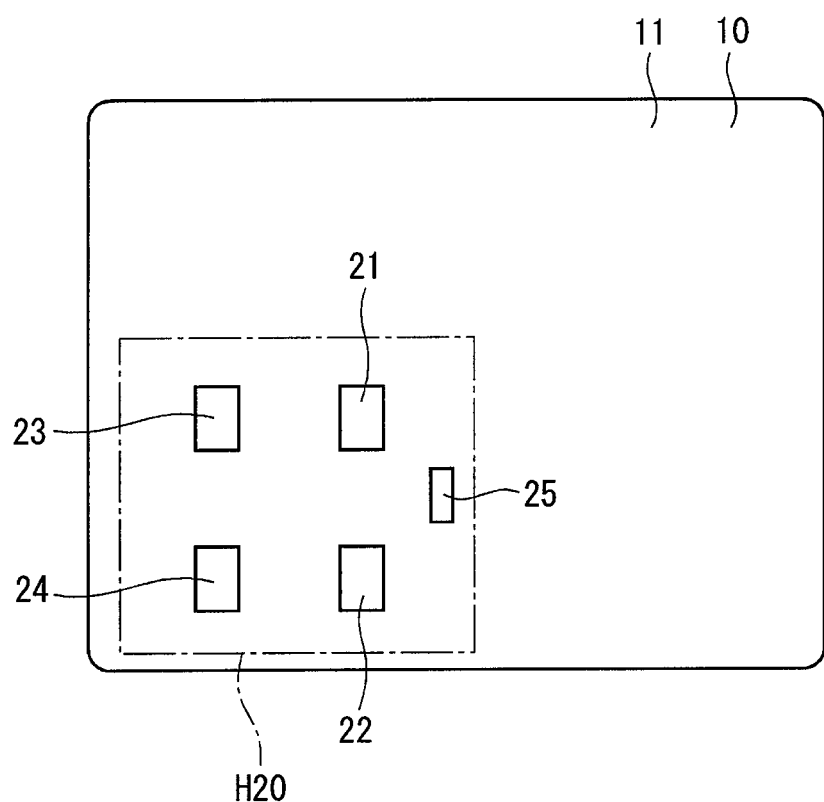
FIG. 14 is a schematic illustration of a radiating region according to a reference example.

A layout of the heating elements 21 to 25 and the radiating gel 79 is now to described. When the radiating gel is disposed over the entire radiation region H20 including the heating elements 21 to 25 as in the reference example as shown in FIG. 14, air may be incorporated into the radiating gel depending on a condition of the applied gel, and thus an air reservoir may be formed in the gel. If the air reservoir is formed directly below one of the switching elements 21 to 24, radiation performance is degraded. It is therefore necessary to design an application method or use a large amount of the gel to suppress formation of the air reservoir in an unintended portion, leading to many steps and high cost.

In the first embodiment, therefore, a region that does not contribute to heat radiation is beforehand set as a non-radiating region, and no radiating gel 79 is disposed in the non-radiating region. In other words, the non-radiating region is a space that may contain air. The layout of the radiating gel 79 is now described with reference to FIGS. 4A, 4B, 5A, and 5B. FIGS. 4A, 4B and FIGS. 5A, 5B schematically illustrate portions concerning radiation from the heating elements 21 to 25 in the substrate 10 and the heat sink 70, respectively, while the portions do not necessarily correspond to the mounting portions for the heating elements in FIG. 2.

Figure 4A:
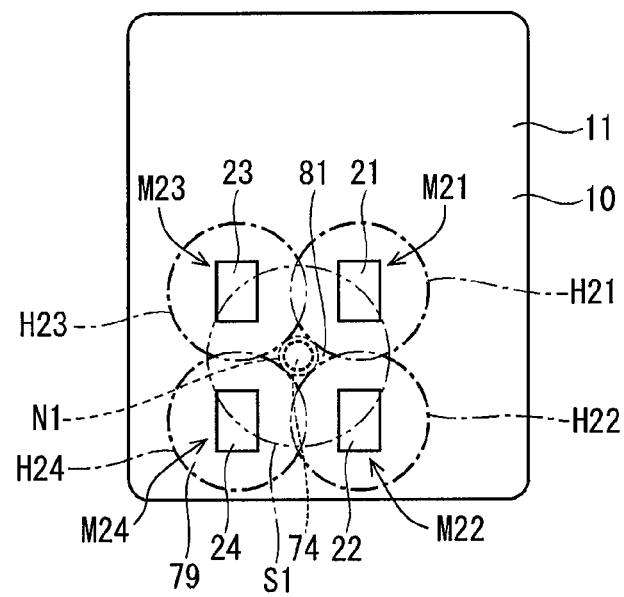
FIG. 4A is a schematic illustration of a radiating region and a non-radiating region according to the first embodiment.
Figure 4B:
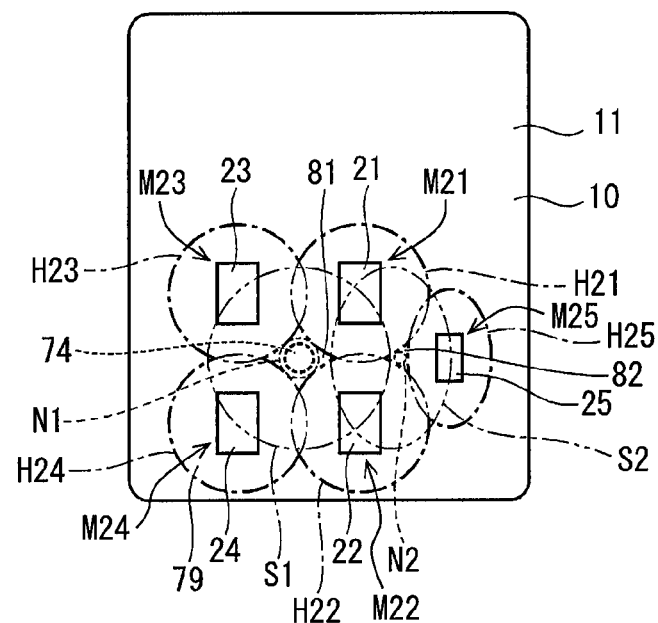
FIG. 4B is a schematic illustration of a radiating region and a non-radiating region according to the first embodiment.

As illustrated in FIGS. 4A and 4B, the radiating region H21 contains a region in which the switching element 21 is disposed, and contributes to heat radiation from the switching element 21. Similarly, the radiating regions H22 to H24 contain regions in which the switching elements 22 to 24 are disposed, and contribute to heat radiation from the switching element 22 to 24, respectively. The radiating gel 79 is disposed in each of the radiating regions H21 to H24.

Figure 5A:
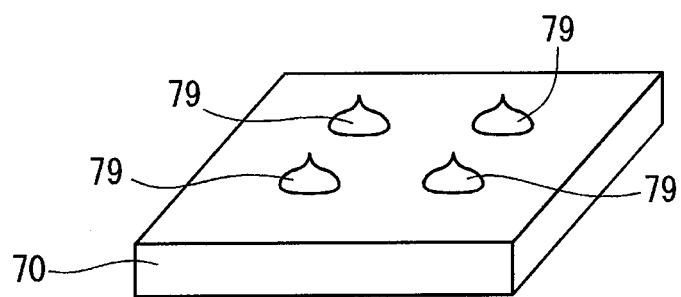
FIG. 5A is a schematic illustration of an application method of a radiating gel according to the first embodiment.
Figure 5B:
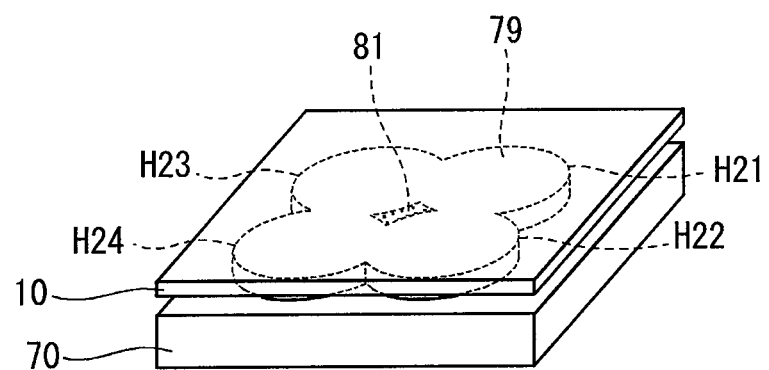
FIG. 5B is a schematic illustration of an application method of a radiating gel according to the first embodiment.
Figure 6:
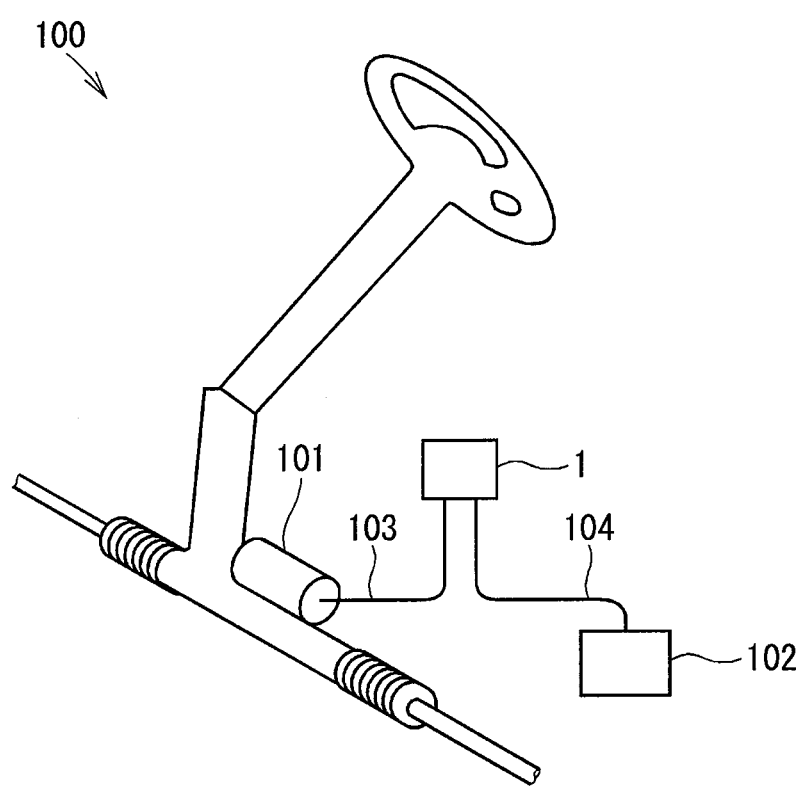
FIG. 6 is a schematic illustration of an electromotive power steering system according to the first embodiment.

As illustrated in FIG. 5A, the radiating gel 79 is applied in a dotted pattern at roughly center of a portion where each of the switching elements 21 to 24 is mounted on the heat sink 70. The amount of applied radiating gel 79 is to the extent that the radiating gel 79 spreads over the radiating regions H21 to H24 while a gap part 81 remains. When the substrate 10 is assembled to the heat sink 70 as illustrated in FIG. 5B, the radiating gel 79 is sandwiched between the heat sink 70 and the substrate 10, and spreads into a roughly circular shape over the radiating regions H21 to H24. In the first embodiment, since the radiating regions H21 to H24 are identical to one another, the gap part 81 is formed at roughly center of the radiating regions H21 to H24. If the radiation regions H21 to H24 surrounding the gap part 81 have the same shape, the gap part 81 is located at the center of the radiating regions H21 to H24. However, the gap part 81 is not always located at the center depending on a shape or area of each radiating region, and can be provided at a desired place by controlling the amount of applied gel or the application pattern.

As illustrated in FIGS. 4A and 4B, in the first embodiment, a portion to be a non-radiating region N1 that does not actively contribute to heat radiation from the switching elements 21 to 24 is beforehand set, and a component disposition line S1 is set such that the non-radiating region N1 is located in the gap part 81. If the radiating regions H21 to H24 have the same circular shape, the component disposition line S1 has a circular shape. The mounting portions M21 to M24 for the switching elements 21 to 24 on the substrate 10 are determined such that the switching elements 21 to 24 are located on the component disposition line S1. The radiating gel 79 is applied onto roughly center of each of the switching elements 21 to 24, and the substrate 10 is assembled to the heat sink 70, thereby the radiating gel 79 spreads over the radiating regions H21 to H24. The gap part 81 is formed in the portion surrounded by the radiating regions H21 to H24 over which the radiating gel 79 spreads. The gap part 81 is a space that is located inside the component disposition line S1 and has an outer edge defined by the radiating gel 79.

As illustrated in FIG. 4B, the radiating region H25 contains a region in which the shunt resistance 25 is disposed, and contributes to heat radiation from the shunt resistance 25 with the radiating gel 79 disposed therein. In the first embodiment, the radiating region H25 has an elliptic shape. A non-radiating region N2 is a portion that does not actively contribute to heat radiation from the radiating regions H21, H22, and H25. Since the radiating region H25 has the elliptic shape, a component disposition line S2 about the non-radiating region N2 also has an elliptic shape. If the component disposition line S2 is divided into two by the major axis of the ellipse, the shunt resistance 25 is disposed on one side while the switching elements 21 and 22 are disposed on the other side. Consequently, when the substrate 10 is assembled to the heat sink 70, the radiating gel 79 spreads over the radiating regions H21, H22, and H25. A gap part 82 is formed in the portion surrounded by the radiating regions H21, H22, and H25 over which the radiating gel 79 spreads. The gap part 82 is a space that is located inside the component disposition line S2 and has an outer edge defined by the radiating gel 79.

Since the radiating gel 79 does not spread into each of the gap parts 81 and 82, a portion for an air reservoir is provided in each gap part. In other words, it can be understood that, in the first embodiment, the air reservoir is intentionally provided in each of the non-radiating regions N1 and N2 to restrain formation of the air reservoir in each of the radiating regions H21 to H25 contributing to heat radiation. This suppresses degradation in radiation performance due to formation of the air reservoir in each of the radiating regions H21 to H25. Although FIGS. 4A and 4B each separately show the radiating regions H21 to H25 overlapping with one another for convenience of description, the radiating gel 79 sandwiched between the substrate 10 and the heat sink 70 actually spreads in one body over a portion enclosed by a dot-and-dash line. The same holds true for FIGS. 11 and 13.

As illustrated in FIG. 1 to FIGS. 4A and 4B, a seat part 74 is provided in the portion of the heat sink 70 corresponding to the gap part 81. The seat part 74 is protrusively provided toward the substrate 10 in the radiating part 71 of the heat sink 70 so as to be in contact with the first surface 11 of the substrate 10. The seat part 74 is formed, depending on shapes of the heat sink 70, with a height at which the heating elements 21 to 25 are each not in contact with the heat sink 70 while the substrate 10 is in contact with the seat part 74. If the radiating part 71 has a uniform height as in the first embodiment, the seat part 74 is formed with a height larger than the height of each of the heating elements 21 to 25. This restrains a short circuit due to contact between the heating elements 21 to 25 and the heat sink 70. No seat part is provided in the portion corresponding to the gap part 82 located between the switching element 21, the switching element 22, and the shunt resistance 25.

A positioning pin 75 is protrusively provided from the seat part 74 toward the substrate 10. The substrate 10 has a positioning hole 15 at a place corresponding to the positioning pin 75. When the substrate 10 is assembled to the heat sink 70, the positioning pin 75 is inserted into the positioning hole 15. This restrains misalignment between the substrate 10 and the heat sink 70 during assembling of the substrate 10 to the heat sink 70, leading to easy assembling. When the substrate 10 is assembled to the heat sink 70, the positioning pin 75 may be isolated from the substrate 10, or may be connected to a ground pattern of the substrate 10. FIGS. 4A and 4B omit the positioning pin 75 and the positioning hole 15. The same holds true for FIG. 11.

In the first embodiment, the seat part 74 is provided in the gap part 81 in order to effectively use the space for the gap part 81. The radiating gel 79 may spread up to the seat part 74 so that the gap part 81 has no air reservoir depending on the amount of applied radiating gel 79 and on size of the seat part 74. Specifically, although the gap part 81 is a space that has an outer edge surrounded by the radiating gel 79 and is allowed to contain the air reservoir, if a component other than the radiating gel 79 is provided in the gap part 81, the gap part 81 may not necessarily contain the air reservoir.

As described in detail above, the electronic control unit 1 of the first embodiment includes the substrate 10, three or more heating elements 21 to 25, the heat sink 70, and the radiating gel 79. The heating elements 21 to 25 are mounted on the substrate 10. The heat sink 70 is provided so as to allow heat radiation from the heating elements 21 to 25.

The radiating gel 79 is provided between the respective heating elements 21 to 25 and the heat sink 70 in the radiating regions H21 to H25 containing the mounting portions M21 to M24 for the heating elements 21 to 25. Each of the gap parts 81 and 82 having no radiating gel 79 therein is formed in the portion surrounded by the radiating regions H21 to H25 corresponding to the three or more heating elements 21 to 25.

In the first embodiment, the non-radiating regions N1 and N2, which do not contribute to heat radiation from the heating elements 21 to 25, are intentionally provided as the gap parts 81 and 82 having no radiating gel 79 therein. This suppresses formation of the air reservoir in each of the radiating regions H21 to H25. Consequently, the radiating gel 79 is appropriately to disposed, and thus it is possible to suppress reduction in radiation efficiency due to formation of the air reservoir in each of the radiating regions H21 to H25. In addition, it is possible to decrease usage of the radiating gel 79 and decrease the number of steps required for application of the radiating gel 79, compared with the case where the radiating gel 79 is applied over the entire area.

The seat part 74 provided on the heat sink 70 projects toward the substrate 10 so as to be in contact with the first surface 11 of the substrate 10 on a side close to the heat sink 70. The heating elements 21 to 25 are each separated from the heat sink 70 while the seat part 74 is in contact with the first surface 11 of the substrate 10. The substrate 10 in contact with the seat part 74 restrains contact between the heat sink 70 and each of the heating elements 21 to 25 mounted on the first surface 11 of the substrate 10, and in turn restrains a short circuit therebetween. Formation of the seat part 74 in the gap part 81 allows the space for the gap part 81 to be effectively used.

The heat sink 70 has thereon the positioning pin 75 projecting toward the substrate 10 in the portion for the gap part 81. The substrate 10 has the positioning hole 15 into which the positioning pin 75 is inserted. The positioning pin 75 is protrusively provided from the seat part 74. Consequently, the substrate 10 is appropriately aligned with the heat sink 70, and is thus easily assembled to the heat sink 70. The heating elements 21 to 25 are mounted on the first surface 11 of the substrate 10 on the side close to the heat sink 70. Consequently, heat from the heating elements 21 to 25 can be effectively radiated to the heat sink 70 compared with the case where the heating elements 21 to 25 are mounted on the second surface 12 of the substrate 10 so that heat is radiated through the substrate 10.

Second Embodiment

Figure 8:
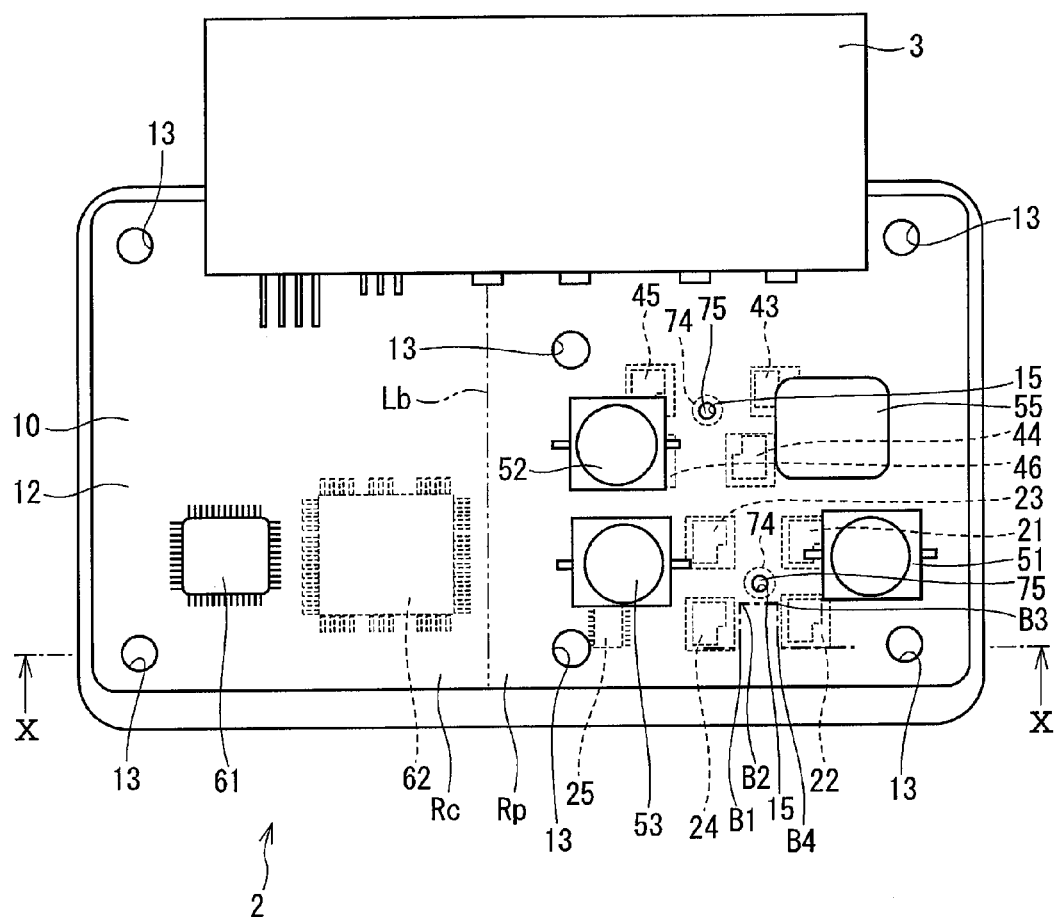
FIG. 8 is a plan view of an electronic control unit according to a second embodiment.
Figure 9:
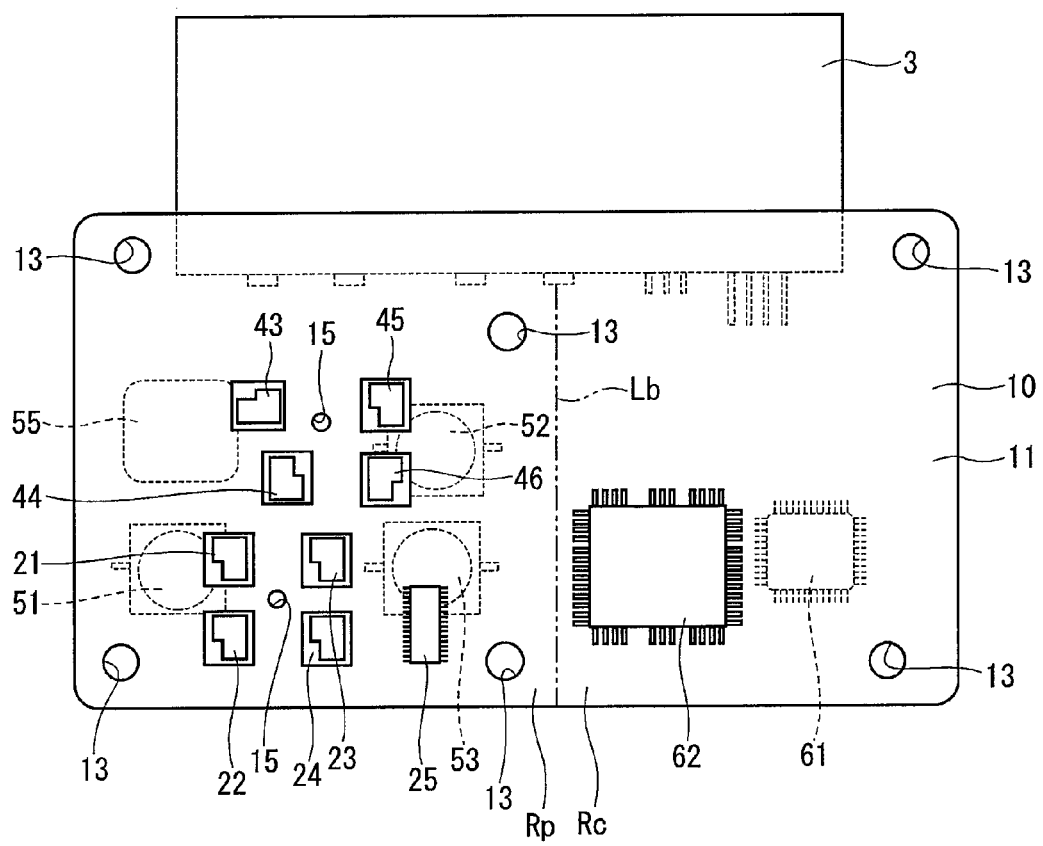
FIG. 9 is a plan view illustrating a substrate surface on a side close to a heat sink according to the second embodiment.
Figure 10:
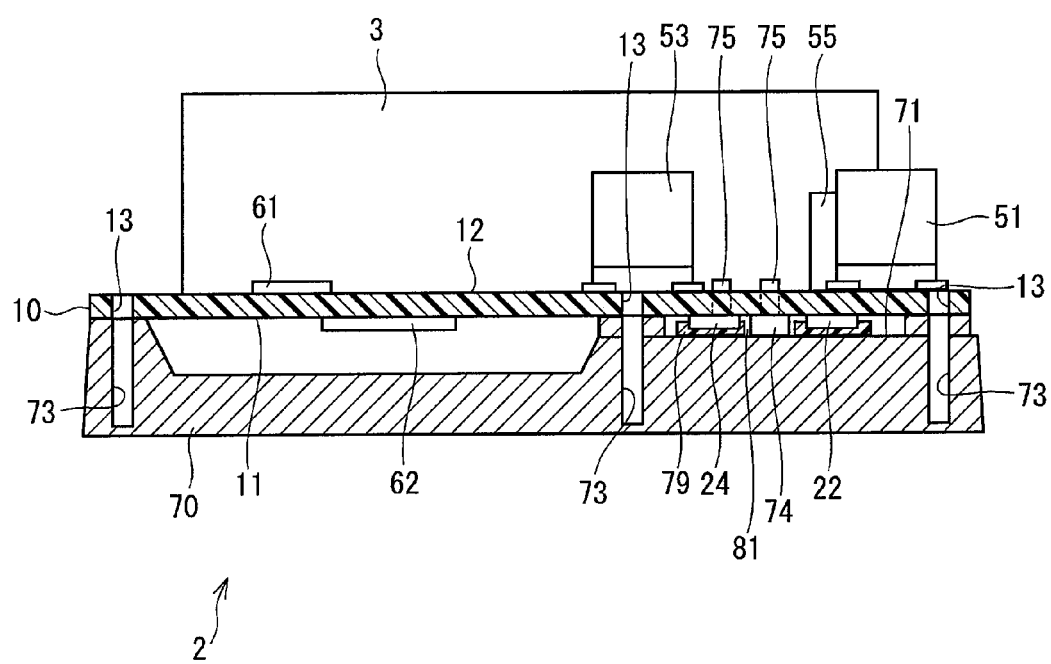
FIG. 10 is a sectional view along a line X-B1-B2-B3-B4-X in FIG. 8.
Figure 11:
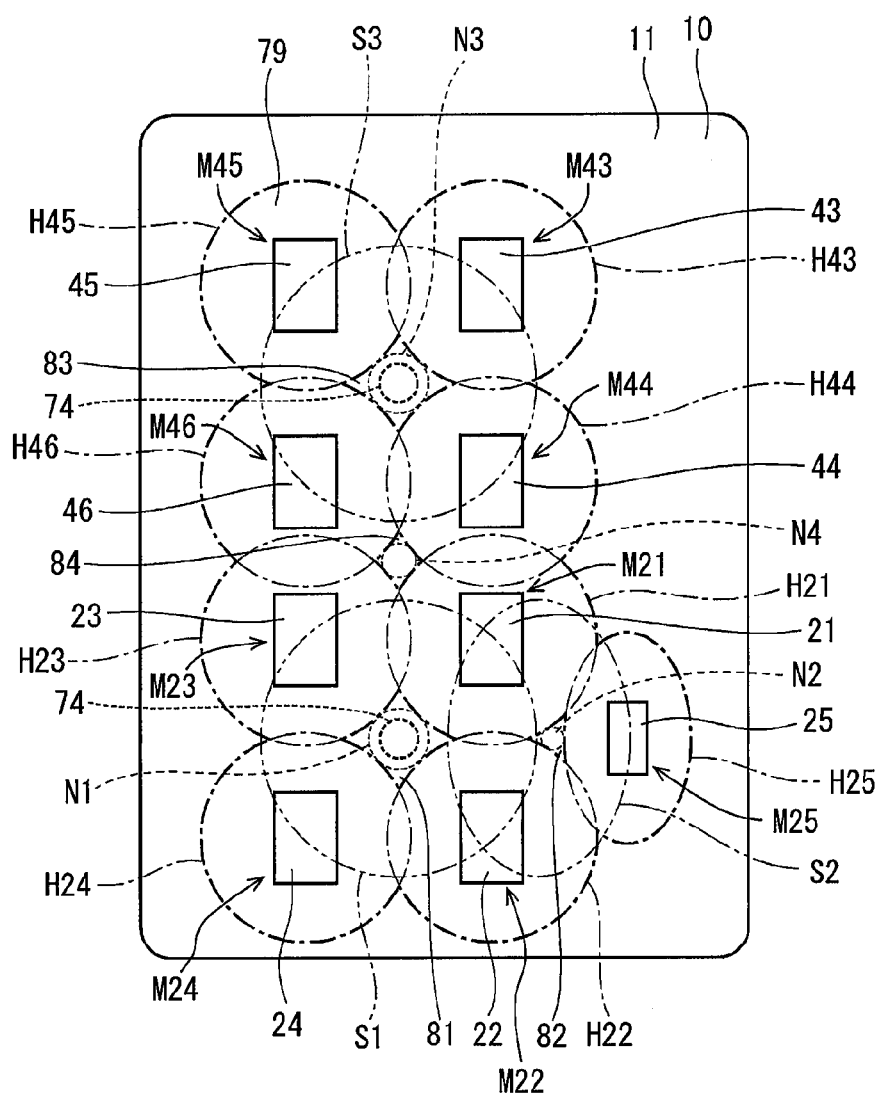
FIG. 11 is a schematic illustration of a radiating region and a non-radiating region according to the second embodiment.
Figure 12:
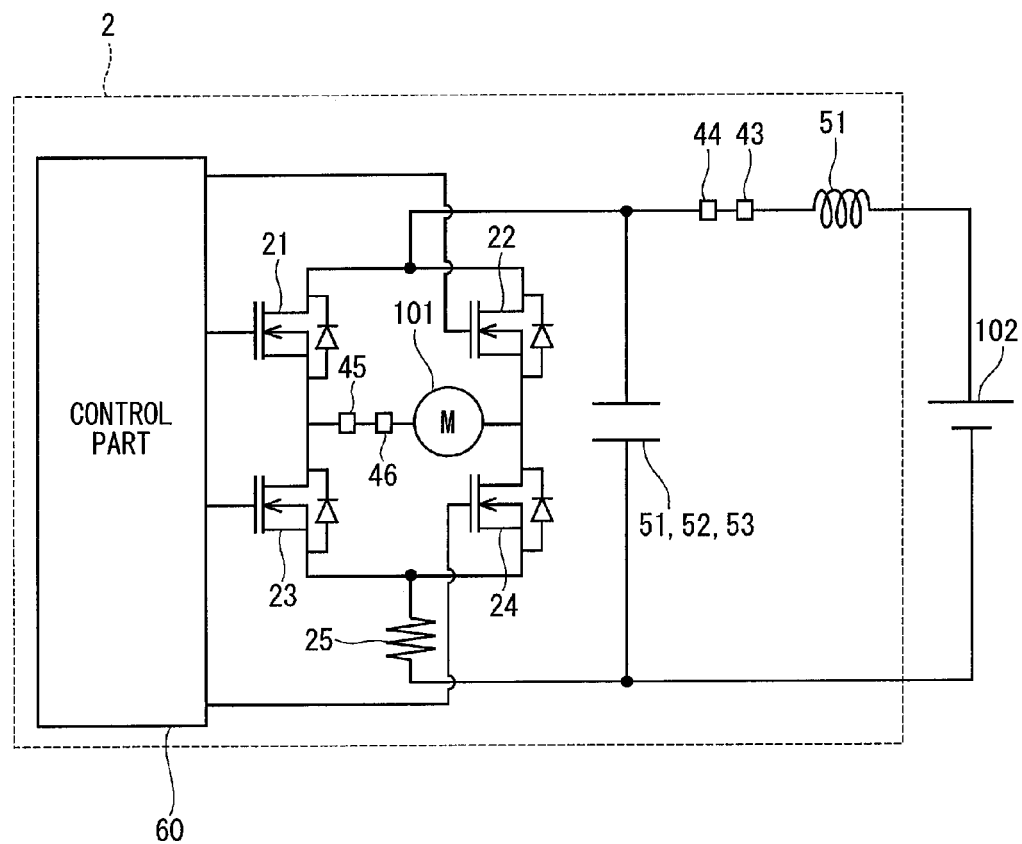
FIG. 12 illustrates an electrical configuration of the electronic control unit according to the second embodiment.

A second embodiment is shown in FIGS. 8 to 12. In the first embodiment, the power relay 41 and the motor relay 42 are each a mechanical relay. As illustrated in FIGS. 9 and 12, an electronic control unit 2 of the second embodiment employs semiconductor elements as power relays 43 and 44 and motor relays 45 and 46. Although the relays 43 to 46 are each MOSFET as with the switching elements 21 to 24, the relays may each configured be IGBT or the like.

As illustrated in FIGS. 8, 9 and 10, the relays 43 to 46 are mounted in the power region Rp of the first surface 11 of the substrate 10. The relays 43 to 46 are provided so as to allow heat radiation to the heat sink 70 through the radiating gel 79. In the second embodiment, the switching elements 21 to 24, the shunt resistance 25, and the relays 43 to 46 correspond to "heating elements".

As illustrated in FIG. 11, a radiating region H43 contains a region in which the power relay 43 is disposed, and contributes to heat radiation from the power relay 43. A radiating region H44 contains a region in which the power relay 44 is disposed, and contributes to heat radiation from the power relay 44. A radiating region H45 contains a region in which the motor relay 45 is disposed, and contributes to heat radiation from the motor relay 45. A radiating region H46 contains a region in which the motor relay 46 is disposed, and contributes to heat radiation from the motor relay 46.

In the second embodiment, since the radiating gel 79 is applied in a dotted pattern in each of the radiating regions H43 to H46, each radiating region has a circular shape. A gap part 83 is formed in the portion surrounded by the radiating gel 79 applied over the radiating regions H43 to H46. A component disposition line S3 is set to a circular shape about a non-radiating region N3 such that the non-radiating region N3 is within the gap part 83. The relays 43 to 46 are disposed on the component disposition line S3.

A gap part 84 is formed in the portion surrounded by the radiating gel 79 applied over the radiating regions H21, H23, H44, and H46. A non-radiating region N4 is within the gap part 84. As with the gap parts 81 and 82, the gap parts 83 and 84 are each a region that is allowed to contain an air reservoir. In the second embodiment, the seat part 74 and the positioning pin 75 are each provided in two parts, i.e., the gap parts 81 and 83. Such a configuration also provides the effects similar to those in the first embodiment.

Third Embodiment

Figure 13A:
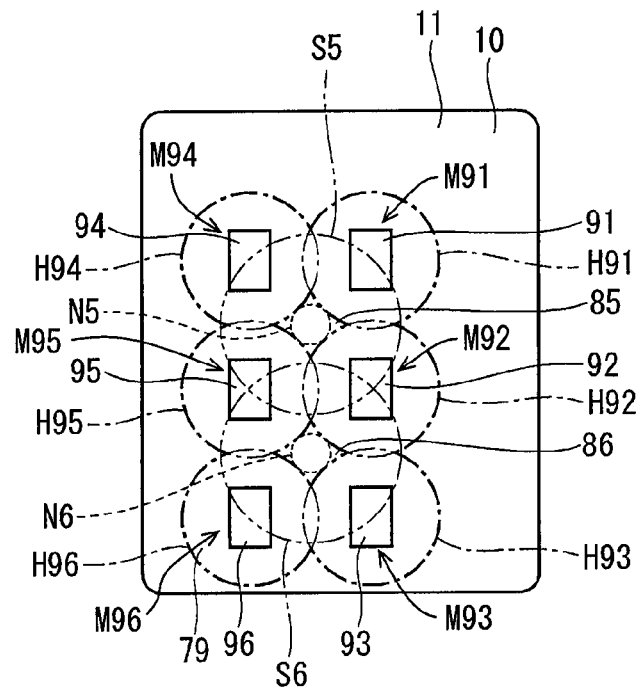
FIG. 13A is a schematic illustration of a radiating region and a non-radiating region according to a third embodiment.
Figure 13B:
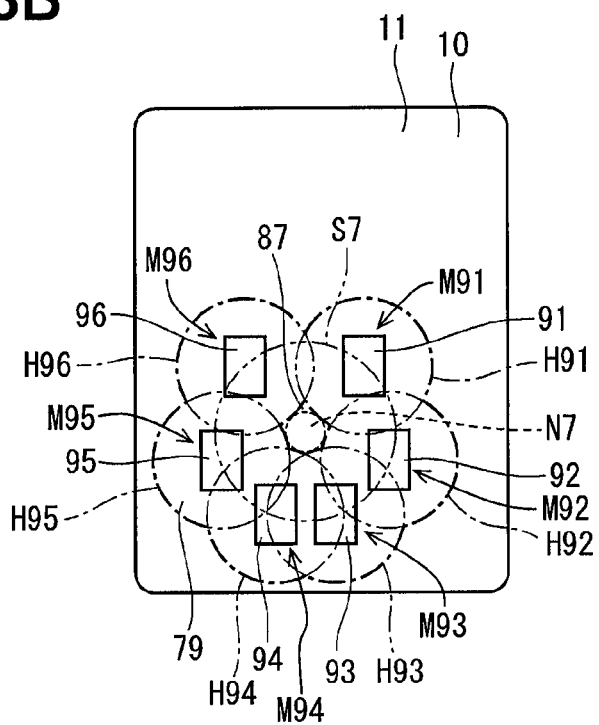
FIG. 13B is a schematic illustration of a radiating region and a non-radiating region according to a third embodiment.

A third embodiment is shown in FIGS. 13A and 13B. FIGS. 13A and 13B illustrate switching elements 91 to 96 mounted on the substrate 10 while omitting other components. The motor in the third embodiment is a three-phase brushless motor. The six switching elements 91 to 96 are mounted on the first surface 11 of the substrate 10. The switching elements 91 to 96 are connected between the motor and a battery that are not shown, and converts power of the battery into a three-phase alternating current that is then supplied to the motor.

Radiating regions H91 to 96 contain regions in which the switching elements 91 to 96 are disposed, and contribute to heat radiation from the switching elements 91 to 96. In the third embodiment, since the radiating gel 79 is applied in a dotted pattern in each of the radiating regions H91 to 96, each radiating region has a circular shape. As illustrated in FIG. 13A, a gap part 85 is formed in the portion surrounded by the radiating gel 79 applied over the radiating regions H91, H92, H94, and H95. A component disposition line S5 is set to a circular shape about a non-radiating region N5 such that the non-radiating region N5 is within the gap part 85. A gap part 86 is formed in the portion surrounded by the radiating gel 79 applied over the radiating regions H92, H93, H95, and H96. A component disposition line S6 is set to a circular shape about a non-radiating region N6 such that the non-radiating region N6 is within the gap part 86. The switching elements 91 to 96 are disposed on the component disposition lines S5 and S6.

As illustrated in FIG. 13B, a gap part 87 may be formed by the radiating gel 79 applied over the radiating regions H91 to H96. In such a case, a component disposition line S7 is set to a circular shape about a non-radiating region N7 such that the non-radiating region N7 is within the gap part 87, and the switching elements 91 to 96 are disposed on the component disposition line S7. While being not shown in FIGS. 13A and 13B, the seat part 74 and the positioning pin 75 may be provided on each of the gap parts 85 to 87 while the positioning hole 15 is provided at a portion of the substrate 10 corresponding to the positioning pin 75. Such a configuration also provides the effects similar to those in the first and second embodiments.

Modifications to the above embodiments will be described below.

(A) Heating Component

In the above-described embodiments, the heating element is a switching element or a shunt resistance. In a modification, the heating element may be an electronic component mounted on a substrate other than the switching element or the shunt resistance. In the above-described embodiments, the switching element or the shunt resistance as the heating element is mounted on the substrate surface on the side close to the heat sink. In a modification, the heating element may be mounted on a substrate surface on a side opposite to the side close to the heat sink.

(B) Radiating Component

In the above-described embodiments, the radiating component is the radiating gel. In a modification, the radiating component may be any component that has a property of spreading over a radiating region when the component is sandwiched by the substrate and the heat sink, and can transfer heat from the heating element to the heat sink. In the above-described embodiments, the gap part is a portion surrounded by the radiating gel applied in correspondence to the three, four, or six heating elements. In a modification, the number of heat elements disposed surrounding the gap part may be any number of three or more. In the first embodiment, the radiating component is applied onto the heat sink, and is provided between the substrate and the heat sink after the substrate is assembled to the heat sink. In a modification, the substrate may be assembled to the heat sink while the radiating component is applied onto the substrate side (in detail, a substrate portion having the radiation element mounted thereon).

(C) Heat Sink

In the above-described embodiments, the seat part is formed integrally with the positioning pin. In a modification, the seat part may be formed separately from the positioning pin, and the seat part and the positioning pin may be formed in the same gap part or may be separately formed in different gap parts. At least one of the seat part and the positioning pin may be omitted. In the above-described embodiments, the heat sink has a flat radiating part. In a modification, the radiating part of the heat sink may have a step height to the extent of allowing the radiating component to spread over the radiating region, such as a recess corresponding to the shape of the switching element. In some shape of the switching element, for example, when the recess corresponding to the shape of the switching element is provided, the height of the seat part may be lower than that of the switching element within a range where the switching element is not in contact with the heat sink.

(D) Substrate

In the above-described embodiments, the substrate is divided into the power region and the control region. The switching elements, the shunt resistance, the capacitors and the coil are mounted in the power region, while the microcomputer and the custom IC are mounted in the control region. In a modification, the substrate may not be divided into the power region and the control region. The electronic components may each be mounted in any portion on either of the first and second surfaces of the substrate. Other components may be mounted on the substrate.

(E) Electronic Control Unit

In the above-described embodiments, the electronic control unit controls motor operation, and is connected to the motor by a harness or the like. In a modification, the electronic control unit may be formed integrally with the motor. In the above-described embodiments, the electronic control unit is used in an electromotive power steering system. In a modification, the electronic control unit may be used not only in the electromotive power steering system but also for controlling motor operation in other system, or for controlling a device other than the motor. The present disclosure is not limited to the above-described embodiments, and can be carried out in various modes within the scope without departing from the gist of the disclosure.

Characteristics of the electronic control unit 1, 2 of the above embodiments can be described as follows.

An electronic control unit 1, 2 includes a substrate 10, three or more heating elements 21-25, 43-46, 91-96, a heat sink 70, three or more radiating components 79, and a gap part 81-87. The three or more heating elements 21-25, 43-46, 91-96 are mounted on the substrate 10. The heat sink 70 is provided to be capable of releasing heat of the three or more heating elements 21-25, 43-46, 91-96. Each of the three or more radiating components 79 is provided between a corresponding one of the three or more heating elements 21-25, 43-46, 91-96 and the heat sink 70, and is provided in a corresponding one of three or more radiating regions H21-H25, H43-H46, H91-H96. Each of the three or more radiating regions H21-H25, H43-H46, H91-H96 includes a corresponding one of mounting portions M21 to M25, M43 to M46 and M91 to M96 of the three or more heating elements 21-25, 43-46, 91-96. The gap part 81-87 is formed in an area surrounded by the three or more radiating components 79 each of which is provided at a corresponding one of the three or more radiating regions H21-H25, H43-H46, H91-H96. Each of the three or more heating elements 21-25, 43-46, 91-96 is located in a corresponding one of the three or more radiating regions H21-H25, H43-H46, H91-H96. There is not any one of the three or more radiating components 79 disposed at the gap part 81-87.

In the present embodiments, a non-radiating region N1-N7 that does not contribute to heat radiation from a heating element 21-25, 43-46, 91-96 is intentionally provided in a form of a gap part 81-87 having no radiating components 79, which suppress formation of an air reservoir in a radiating region H21-H25, H43-H46, H91-H96. Consequently, the radiating component 79 is appropriately disposed, and it is possible to suppress a reduction in radiation efficiency due to formation of the air reservoir in the radiating region H21-H25, H43-H46, H91-H96.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
a substrate;
three or more heating elements that are mounted on the substrate;
a heat sink that is provided to be capable of releasing heat of the three or more heating elements;
three or more radiating components each of which is provided between a corresponding one of the three or more heating elements and the heat sink and is provided in a corresponding one of three or more radiating regions, wherein each of the three or more radiating regions includes a corresponding one of mounting portions of the three or more heating elements; and
a gap part that is formed in an area surrounded completely by the three or more radiating components each of which is provided at a corresponding one of the three or more radiating regions, wherein:
the gap part is a space that has an outer edge defined by the three or more radiating components;
each of the three or more heating elements is located in a corresponding one of the three or more radiating regions; and
there is not any one of the three or more radiating components disposed at the gap part.

2. The electronic control unit according to claim 1, wherein:
the heat sink includes a seat part that projects toward the substrate at an area serving as the gap part and that is in contact with a surface of the substrate on the heat sink-side; and
in a state where the seat part and the substrate are in contact with each other, the three or more heating elements and the heat sink are separate from each other.

3. The electronic control unit according to claim 2, wherein:
the heat sink includes a positioning pin that projects toward the substrate at the area serving as the gap part; and
the substrate includes a positioning hole through which the positioning pin is inserted.

4. The electronic control unit according to claim 3, wherein the positioning pin is formed to project from the seat part.

5. The electronic control unit according to claim 1, wherein the three or more heating elements are mounted on a surface of the substrate on the heat sink-side.

6. An electronic control unit comprising:
an electric connection plate;
three or more heating elements that are connected to the electric connection plate;
a heat sink that is provided to be capable of releasing heat of the three or more heating elements;
three or more radiating components each of which is provided between a corresponding one of the three or more heating elements and the heat sink and is provided in a corresponding one of three or more radiating regions, wherein each of the three or more radiating regions includes a corresponding one of connecting portions of the three or more heating elements; and
a gap part that is formed in an area surrounded completely by the three or more radiating components each of which is provided at a corresponding one of the three or more radiating regions, wherein:
each of the three or more heating elements is located in a corresponding one of the three or more radiating regions;
there is not any one of the three or more radiating components disposed at the gap part; and
the gap part is a space that has an outer edge defined by the three or more radiating components.

* * * * *